(12) United States Patent
Wiest et al.

(10) Patent No.: US 10,247,580 B2
(45) Date of Patent: Apr. 2, 2019

(54) CIRCUIT AND METHOD FOR EVALUATING MEASUREMENT SIGNALS AND SENSOR SYSTEM FOR CAPACITIVELY DETECTING OBSTACLES

(71) Applicant: MAYSER GMBH & CO. KG, Ulm (DE)

(72) Inventors: Thomas Wiest, Ochsenhausen (DE); Manuel Kelsch, Ulm (DE)

(73) Assignee: MAYSER GMBH & CO. KG, Ulm (DE)

( * ) Notice: Subject to any disclaimer, the term of this patent is extended or adjusted under 35 U.S.C. 154(b) by 24 days.

(21) Appl. No.: 15/501,609

(22) PCT Filed: Aug. 10, 2015

(86) PCT No.: PCT/EP2015/068368
§ 371 (c)(1),
(2) Date: Feb. 3, 2017

(87) PCT Pub. No.: WO2016/023862
PCT Pub. Date: Feb. 18, 2016

(65) Prior Publication Data
US 2017/0241811 A1 Aug. 24, 2017

(30) Foreign Application Priority Data
Aug. 15, 2014 (DE) .................. 10 2014 216 246

(51) Int. Cl.
*G01R 27/26* (2006.01)
*G01D 5/24* (2006.01)
(Continued)

(52) U.S. Cl.
CPC .............. *G01D 5/24* (2013.01); *H03K 17/955* (2013.01); *H03K 9/08* (2013.01); *H03K 2217/96075* (2013.01)

(58) Field of Classification Search
CPC ........ G01R 27/04; G01D 5/24; H03K 17/955; H03K 17/945; H03K 2017/9602;
(Continued)

(56) References Cited

U.S. PATENT DOCUMENTS 4,857,855 A * 8/1989 Matsuno ................ G01R 27/18
324/521
5,066,920 A * 11/1991 Suptitz .................. G01R 27/18
324/510
(Continued)

FOREIGN PATENT DOCUMENTS

DE 36 01 407 A1 7/1987
DE 101 07 547 A1 8/2002
(Continued)

OTHER PUBLICATIONS

International Search Report issued PCT/EP2015/068368 with English translation dated Oct. 16, 2015 (5 pages).
(Continued)

*Primary Examiner* — Thang X Le
(74) *Attorney, Agent, or Firm* — Flynn Thiel, P.C.

(57) ABSTRACT

A circuit for evaluating measurement signals of at least one sensor with a control circuit. A control signal having a first frequency is generated by a control section of the control circuit, and the control signal is applied to the sensor. An electronic evaluation unit is provided for generating an evaluation signal originating from a measurement signal generated by the sensor. The electronic evaluation unit generates an opposing signal having the first frequency and a modifiable phase angle and superposes the opposing signal and the evaluation signal. The signal resulting from the superposition of the opposing signal and the evaluation signal is fed to a synchronous demodulator of the electronic evaluation unit.

20 Claims, 3 Drawing Sheets

(51) Int. Cl.
*H03K 17/955* (2006.01)
*H03K 9/08* (2006.01)

(58) Field of Classification Search
CPC . H03K 2017/9613; H03K 2217/96075; G08B 13/08; G08B 324/632; G08B 324/637; G08B 324/654; G08B 324/66
See application file for complete search history.

(56) References Cited

U.S. PATENT DOCUMENTS

| | | | |
|---|---|---|---|
| 5,469,066 A * | 11/1995 | Ito | G01R 31/1272 324/541 |
| 5,526,061 A * | 6/1996 | Brilka | H04N 5/455 348/537 |
| 6,208,134 B1 * | 3/2001 | Demma | G01B 7/023 324/207.12 |
| 6,714,025 B2 | 3/2004 | Mohaupt et al. | |
| 8,148,999 B2 | 4/2012 | Fasshauer et al. | |
| 8,334,623 B2 | 12/2012 | Reime | |
| 9,035,662 B2 | 5/2015 | Reime | |
| 2002/0125940 A1 | 9/2002 | Mohaupt et al. | |
| 2002/0154039 A1 | 10/2002 | Lambert et al. | |
| 2009/0212849 A1 | 8/2009 | Reime | |
| 2011/0062963 A1 * | 3/2011 | Fasshauer | G08B 13/08 324/632 |
| 2011/0095771 A1 | 4/2011 | Reime | |
| 2013/0193955 A1 | 8/2013 | Krapt et al. | |

FOREIGN PATENT DOCUMENTS

| | | |
|---|---|---|
| DE | 10 2008 047 434 A1 | 5/2009 |
| DE | 10 2008 005 783 A1 | 7/2009 |
| DE | 10 2009 057 439 A1 | 5/2011 |
| DE | 10 2010 028 719 A1 | 11/2011 |
| DE | 10 2012 217 086 B3 | 3/2014 |

OTHER PUBLICATIONS

Form PCT/ISA/220 issued in PCT/EP2015/068368 dated Oct. 16, 2015 (1 page).
Form PCT/ISA/237 issued in PCT/EP2015/068368 dated Oct. 16, 2015 (6 pages).
German Office Action issued in Appln. No. 102014216246.7 dated Jun. 15, 2015 (6 pages).

* cited by examiner

CIRCUIT AND METHOD FOR EVALUATING MEASUREMENT SIGNALS AND SENSOR SYSTEM FOR CAPACITIVELY DETECTING OBSTACLES

FIELD OF THE INVENTION

The invention relates to a circuit and a method for evaluating measurement signals.

The invention also relates to a sensor system for capacitively detecting obstacles with a capacitive sensor and a circuit according to the invention.

BACKGROUND OF THE INVENTION

A switching strip system for capacitively detecting obstacles is known from U.S. Pat. No. 8,334,623 B2. The embodiment shown there in FIG. 14 has a bridge circuit, wherein the two conductors of a switching strip profile are connected in each case to one end of the bridge branch. However, the switching strip system is evaluated by comparing a voltage on the conductor located in front in the direction of detection with a reference signal unaffected by a change in the capacitance between the two conductors and an obstacle.

A sensor system for capacitively detecting obstacles is known from German laid-open specification DE 10 2008 005 783 A1, in which a control signal is fed into two conductive elements of a capacitive sensor. The inverted control signal is superposed with the signal of the conductor in front in the direction of detection and the superposition signal is adjusted to zero. If an obstacle is present in the detection area, it can be detected by means of the readjustment which is then required.

SUMMARY OF THE INVENTION

An improved circuit and an improved method for evaluating measurement signals with an improved sensor system are intended to be provided with the invention.

According to the invention, a circuit for evaluating measurement signals of at least one sensor with a control circuit is provided for this purpose, wherein a control signal having a first frequency is generated by means of a control section of the control circuit, wherein the control signal is applied to the at least one sensor, wherein an electronic evaluation unit is provided for generating an evaluation signal originating from a measurement signal generated with the sensor, wherein the electronic evaluation unit has means for generating an opposing signal having the first frequency and a modifiable phase angle and means for superposing the opposing signal and the evaluation signal, and wherein the signal resulting from the superposition of the opposing signal and the evaluation signal is fed to a synchronous demodulator of the electronic evaluation unit.

The generation of an opposing signal having the same frequency as the control signal and its superposition on the evaluation signal result in a highly sensitive detection of obstacles, but, above all, in the fact that the system can be adjusted very reliably and quickly in the idle state, i.e. without the presence of an obstacle. Due to the modifiable phase angle of the opposing signal, phase shifts in the evaluation signal which occur due to the installation conditions even without the presence of an obstacle can be compensated for in a very simple manner. The sensor system can even be balanced fully automatically in a balancing operation, thus making the circuit according to the invention particularly suitable for use in series production, for example for detecting obstacles in the area of a door or tailgate of a motor vehicle. The superposition of the opposing signal and the evaluation signal and the feeding of the signal resulting from the superposition to a synchronous demodulator offers further advantages in relation to the sensitivity of the system in a detection operation, but also in relation to the simple initialization and balancing of the system in a balancing operation, i.e. without the presence of an obstacle.

In one development of the invention, the means for generating the opposing signal are designed to modify an amplitude of the opposing signal.

In this way, the sensor system can be adjusted particularly simply and quickly in a balancing operation according to the specifically prevailing installation conditions.

In one development of the invention, the means for generating the opposing signal operate depending on an output signal of the synchronous demodulator.

In the balanced condition of the system, i.e., for example, without the presence of an obstacle, a signal having the value zero or a constant DC voltage having a predefined value is present at the output of the synchronous demodulator. If a desired balancing of the system has not yet been achieved, the output signal of the synchronous demodulator can be used in a very simple manner as an input parameter to modify the opposing signal in relation to the phase angle and/or amplitude and thereby achieve a balancing.

In one development of the invention, a phase shift and/or an amplitude of the opposing signal is/are evaluated, in particular for detecting an obstacle.

If, for example, the output signal is kept at a constant value during the detection operation also, the phase shift and/or amplitude modification of the opposing signal required for this purpose can be used, for example, to detect an obstacle.

In one development of the invention, an output signal of the synchronous demodulator is evaluated, in particular for detecting an obstacle.

The output signal of the synchronous demodulator provides reliable information on whether the measurement signal has changed and, for example, an obstacle is present in the detection area of the sensor.

In one development of the invention, the electronic evaluation unit has a control circuit, wherein a phase shift of the opposing signal is used to adjust an output signal of the synchronous demodulator.

The output signal of the synchronous demodulator can be kept at a constant value by means of a phase shift of the opposing signal. The phase shift of the opposing signal required for this purpose can then be used, for example, to detect an obstacle.

The invention also relates to a method for evaluating measurement signals which are generated by at least one sensor, with a circuit according to the invention, with the steps of applying a control signal having a first frequency to the sensor, generating an opposing signal having the first frequency and a modifiable phase angle, generating an evaluation signal originating from a measurement signal generated with the sensor, superposing the evaluation signal and the opposing signal and feeding the signal resulting from the superposition to a synchronous demodulator.

In one development of the invention, the circuit is balanced automatically in a balancing operation by adjusting a phase shift of the opposing signal depending on an output signal of the synchronous demodulator.

In this way, the circuit according to the invention or a sensor system provided with the circuit can be adjusted according to the respectively prevailing installation conditions. This is important given that the installation conditions are never exactly identical, even if the circuit or the sensor system is installed during a series production on a door or tailgate of a motor vehicle. An automatic balancing of the sensor system is then extremely advantageous in that it does not have to take account of the slightly different installation conditions in the detection operation. A balancing of this type according to the respectively prevailing installation conditions can be performed quickly and reliably by adjusting a phase shift of the opposing signal.

In one development of the invention, a phase shift of the opposing signal and a clock of the synchronous demodulator are set in a balancing operation in such a way that the evaluation signal, the opposing signal and the clock of the synchronous demodulator are in-phase.

An in-phase adjustment of this type is undertaken in a first step in the balancing operation.

In one development of the invention, an amplitude of the opposing signal is adjusted in a balancing operation in such a way that the output signal of the synchronous demodulator has a value of zero or a predefined value.

Following the in-phase adjustment of the evaluation signal, the opposing signal and the synchronous demodulator, the amplitude of the opposing signal is then adjusted in such a way that the output signal of the synchronous demodulator has a predefined value. In this way, the installation conditions can be compensated for and the circuit and sensor system can be balanced quickly and reliably according to the respectively prevailing installation conditions.

In one development of the invention, a phase shift of the opposing signal is evaluated in a detection operation, in particular for detecting an obstacle.

In one development of the invention, an output signal of the synchronous generator is evaluated in a detection operation, in particular for detecting an obstacle.

In one development of the invention, an output signal of the synchronous generator is adjusted to a value of zero or a predefined value in a detection operation.

In one development of the invention, a phase shift and/or an amplitude of the opposing signal is/are provided in the adjustment as a setting parameter.

The invention also relates to a sensor system for capacitively detecting obstacles with at least one capacitive sensor and a circuit according to the invention.

BRIEF DESCRIPTION OF THE DRAWINGS

Further features and advantages of the invention can be found in the claims and in the following description of preferred embodiments of the invention in connection with the description. Individual features of the different embodiments shown and described can be combined with one another in any given manner without exceeding the scope of the invention. In the drawings:

DETAILED DESCRIPTION

Figure 1:
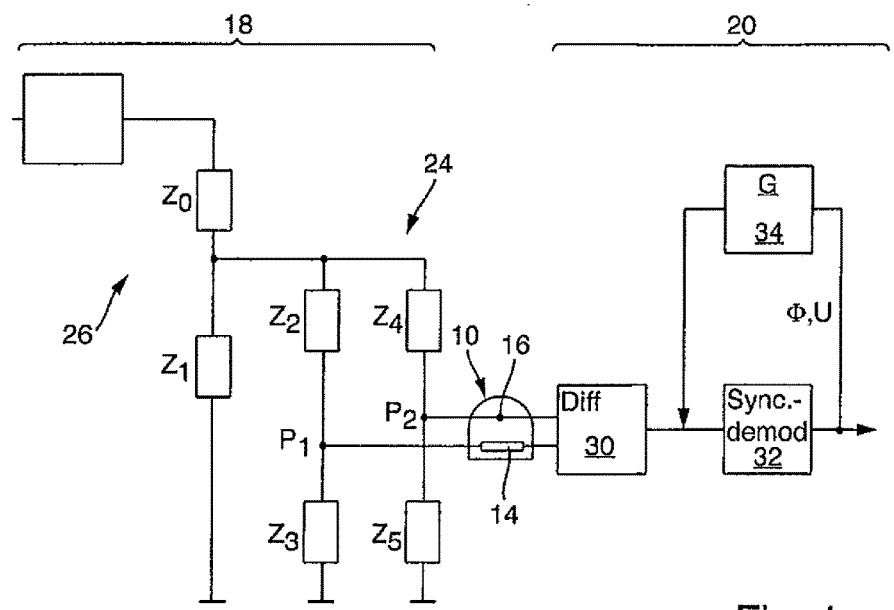
FIG. 1 shows a schematic representation of a sensor system according to the invention according to a first embodiment.

The representation in FIG. 1 shows schematically a sensor system according to a first embodiment of the invention. The invention relates to a circuit for evaluating measurement signals of at least one sensor, e.g., a sensor 10, with a control circuit 18. A control signal having a first frequency is generated by a control section 26 of the control circuit 18. The control signal is applied to the sensor 10. An electronic evaluation unit 20 is provided as a part of the circuit for generating an evaluation signal originating from a measurement signal generated by the sensor 10. The electronic evaluation unit 20 has a circuit 34 for generating an opposing signal having the first frequency and a modifiable phase angle and means for superposing the opposing signal and the evaluation signal. The signal resulting from the superposition of the opposing signal and the evaluation signal is fed to a synchronous demodulator 32 of the electronic evaluation unit 20.

Two conductors 14, 16 of the sensor 10 or switching strip are connected, on the one hand, to a first end P1 and to a second end P2 of a bridge branch of a bridge circuit 24 encompassing elements Z0-Z5, and, on the other hand, to the inputs of a differentiator 30 as shown in FIG. 1. The output signal of the differentiator 30 is in turn fed to a synchronous demodulator 32. The output signal of the synchronous demodulator 32 serves, inter alia, to generate an opposing signal G with the circuit 34 which is then in turn superposed between the output of the differentiator 30 and the input of the synchronous demodulator 32 with the output signal of the differentiator 30. The phase and amplitude of the opposing signal G can be set so that a zero signal or a signal with a constant predefined value is produced at the input of the synchronous demodulator 32 in the balanced state of the system, but without the presence of an obstacle. The opposing signal can then be modified only during the initial balancing of the system, i.e., for example, following the installation of the sensor system in a motor vehicle. This balancing can be performed automatically in such a way that the opposing signal G is modified until a zero signal or a signal with a predefined value is present at the output of the synchronous demodulator 32. Tests have shown that a sensor system according to the invention can be adjusted quickly, precisely and unproblematically in this way.

If an obstacle is then brought close to the sensor 10, the output signal of the differentiator 30 and therefore also the input signal and the output signal of the synchronous demodulator 32 change and the obstacle can be detected through this signal deviation.

In addition, it is also possible to adjust the signal at the input of the synchronous demodulator 32 to zero even during ongoing operation by superposing the output signal of the differentiator 30 with the opposing signal G. With such an adjustment of the input signal of the synchronous demodulator 32 to zero, the signal between the differentiator 30 and the synchronous demodulator 32 can be very highly amplified, also resulting in a very high resolution of the sensor system according to the invention. Either a DC voltage at the output of the synchronous demodulator 32 or the amplitude and phase angle of the opposing signal G can then be used to evaluate an approach of an obstacle. Further information relating to the obstacle can be obtained through the knowledge of the phase angle of the opposing signal.

Figure 2:
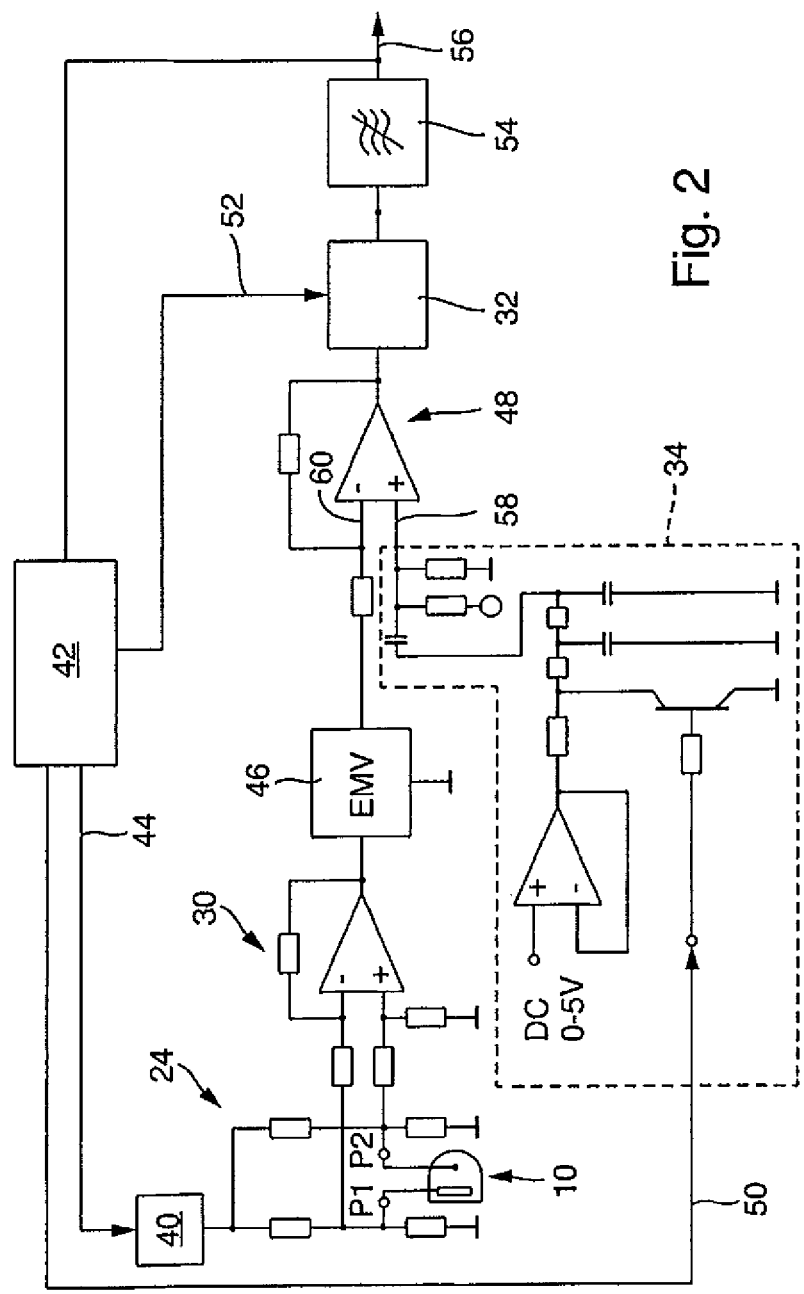
FIG. 2 shows a schematic representation of a sensor system according to the invention according to a second embodiment.

The representation in FIG. 2 shows schematically a sensor system according to the invention according to a further embodiment of the invention. In the same way as in the first embodiment, the two conductors of the sensor 10 are connected to both ends P1 and P2 of the bridge circuit 24 which is otherwise also identical to the embodiment shown in FIG. 1 and will not therefore be explained again. A control signal is generated by means of a circuit 40 which has, for example, an oscillating circuit. A first clock 44 is fed to the circuit 40 by an electronic control unit 42. The electronic control unit 42 may, for example, have a microprocessor and, as will be explained below, provides clock signals which have identical frequencies but are phase-shifted if necessary.

As in the embodiment shown in FIG. 1, the signals at both ends P1, P2 of the bridge branch are fed to a differentiator 30 which will not be explained again. The output signal of the differentiator is fed to a circuit 46 which reduces the influences of electromagnetic interference, but which will not be explained further and is designed in a conventional manner. Originating from the circuit 46, the signal is fed to a further differential amplifier 48. The other input of the differential amplifier 48 is fed by means of a circuit 34 which generates an opposing signal. This circuit 34 receives a second clock 50 from the electronic control unit 42. The first clock 44 which defines the frequency of the control signal fed to the switching strip 10 and the frequency of the second clock 50 for generating the opposing signal have identical frequencies, but are phase-shifted if necessary. The first clock 44 and the second clock 50 are advantageously designed as a sinusoidal signal.

Originating from the differential amplifier 48, the resulting signal is fed to the synchronous demodulator 32. A sampling behavior of the synchronous demodulator 32 is controlled via a third clock 52 which is similarly generated by the electronic control unit 42 and has the same frequency as the first clock 44 and the second clock 50, but is phase-shifted if necessary in relation to them.

The output signal of the synchronous demodulator 32 is fed via a low-pass filter 54. It is evident here that the low-pass filter 54 is seen as a unit with the synchronous demodulator 32. Reference is therefore made below to the output signal of the synchronous demodulator 32, wherein the signal present at the output of the low-pass filter 54 at the point 56 is meant.

In order to initialize the sensor system shown in FIG. 2 and therefore adjust it according to the specifically prevailing installation conditions, it is first ensured that no obstacle is located in the detection area of the sensor 10.

The sensor system is furthermore in operation, i.e. the electronic control unit 42 generates the first clock 44, so that a sinusoidal signal is applied to the sensor 10.

An opposing signal which drives the input of the differential amplifier 48 into saturation is then applied by means of the circuit 34 to the non-inverting input 58 of the differential amplifier 48. The signal at the output of the differential amplifier 48 then more or less represents a square-wave signal. For this purpose, the evaluation signal can be deactivated at the input of the differential amplifier 48. However, this is not absolutely necessary, since the opposing signal at the input 58 of the differential amplifier 48 is significantly greater and drives the operational amplifier into saturation. If the operational amplifier is in saturation, the phase angle of the opposing signal can be modified by a phase shift in the second clock 50 until a DC voltage with a predefined value is set at the output of the synchronous demodulator, i.e. at the point 56. This predefined value can occur due to the design of the sensor system only if the synchronous demodulator 32 does not sample the signal at its zero-crossing, but shifted through 90° in relation thereto. In the procedure just described in relation to the frequency, the third clock 52 corresponds to the first clock 44.

In a second step, the phase angle of the opposing signal at the input 58 of the differential amplifier 48 is shifted through 90° in relation to the third clock 52. This is done by means of the electronic control unit 42. To do this, the electronic control unit 42 can couple the phase angle of the second clock 50 permanently to the third clock 52.

In the next step, the influence of the opposing signal at the input 58 of the differential amplifier 48 is then deactivated. This can be done, for example, by deactivating the input 58 or by setting the amplitude of the opposing signal to zero volts. Only the evaluation signal then affects the differential amplifier 48 at its input 60. The sampling time of the synchronous demodulator 32 and therefore the second clock 50 are then phase-shifted until the predefined DC voltage value is again set at the point 56, i.e. at the output of the synchronous demodulator 32. If this is the case, the sampling time of the synchronous demodulator 32 is at a point which is located at 90° in relation to the zero-crossing of the evaluation signal at the input 60 of the differential amplifier 48. The sampling time of the synchronous demodulator 32 is modified through an adjustment of the third clock 52 by the electronic control unit 42. If the predefined value is reached at point 56, the signals at both inputs 58, 60 and the third clock 52 of the synchronous demodulator 32 are in-phase.

In a next step, a zero balancing is effected by increasing the amplitude of the opposing signal G at the output 58 of the differential amplifier 48 until the predefined value is again obtained at the output of the synchronous demodulator 32, i.e. at the point 56.

The balancing operation can thus be concluded and a transition to a detection operation can take place. In a detection operation, the output signal of the synchronous demodulator, i.e. the signal at the point 56, can be used to detect an obstacle. Alternatively, an adjustment of the output signal at the point 56 to the value zero or a predefined value can be provided by modifying the phase angle or the amplitude of the opposing signal at the input 58 of the differential amplifier 48. The phase angle or the amplitude of the opposing signal can then alternatively or additionally be used to detect an obstacle.

Figure 3:
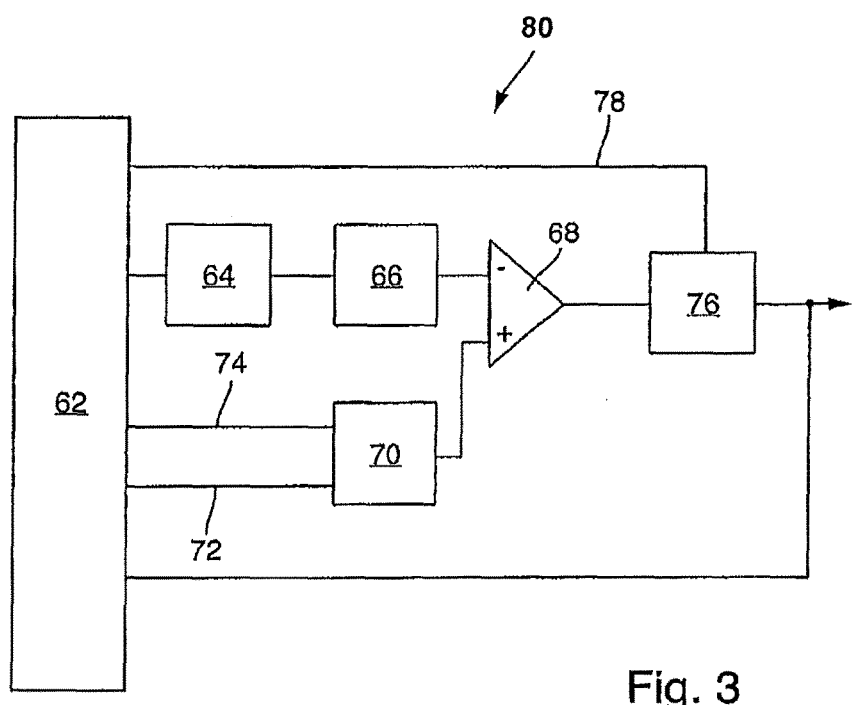
FIG. 3 shows a schematic representation of a sensor system according to the invention according to a third embodiment.

FIG. 3 shows schematically a sensor system 80 according to the invention with a circuit according to the invention according to a third embodiment. The sensor system 80 has an electronic control unit 62 which is provided, inter alia, for the generation of clock signals and for the supply of energy. A first clock signal is fed to a control section 64 which generates a control signal having a first frequency. The control signal is then applied to a sensor 66. The sensor 66 may, for example, transmit the control signal into a measuring room. The sensor 66 also supplies a measurement signal as output which then, depending on the presence or absence of a situation requiring detection, is modified in a typical manner in relation to the control signal. Using the example of a capacitive sensor, the measurement signal changes compared with the control signal due to the presence of a capacitance in the measuring room, for example a human hand. The measurement signal is then fed to an operational amplifier 68. The opposing signal is applied to a further input of the operational amplifier 68 by a section 70 for generating an opposing signal. To generate the opposing signal, the section 70 receives, on the one hand, a clock signal 72 from the electronic control unit and an energy supply via a line 74. At least the phase of the opposing signal can be modified with the section 70. The opposing signal has the same frequency as the control signal. The opposing signal and the evaluation signal are then superposed by means of the operational amplifier 68 and are fed to a synchronous demodulator 76. The synchronous demodulator 76 has a downstream low-pass filter which, for the sake of simplicity, is not shown in the representation in FIG. 3. An output signal of the synchronous demodulator 76 is fed back to the electronic control unit 62 and the synchronous demodulator receives a clock 78 from the electronic control unit 62. The circuit represented in FIG. 3 is shown only schematically in order to be able to illustrate and explain the principle according to the invention. Through a modification of the phase angle and/or the amplitude of the opposing signal which is generated with the section 70, a predefined value can be set at the output of the synchronous demodulator 76 and the sensor system 80 can thereby be balanced in a very simple manner before the actual start of the measurement. Different installation conditions of the sensor 66 can thereby be compensated for in an extremely simple manner.

The invention claimed is:

1. A circuit for evaluating measurement signals, the circuit comprising:
    at least one sensor having two conductors, wherein the at least one sensor is connected with a control circuit, wherein the control circuit has a bridge circuit having a bridge branch with a first end and a second end, a first one of the two conductors being connected to the first end of the bridge branch and a second one of the two conductors being connected to the second end of the bridge branch, wherein a control signal having a first frequency is generated by a control section of the control circuit, wherein the control signal is applied to the two conductors of the at least one sensor; and
    an electronic evaluation unit for generating an evaluation signal originating from a measurement signal generated with the at least one sensor, wherein the electronic evaluation unit has an opposing signal generating circuit for generating an opposing signal having the first frequency and a modifiable phase angle and superposes the opposing signal and the evaluation signal, and wherein a signal resulting from the superposition of the opposing signal and the evaluation signal is fed to a synchronous demodulator of the electronic evaluation unit.

2. The circuit as claimed in claim 1, wherein the opposing signal generating circuit for generating the opposing signal is designed to modify an amplitude of the opposing signal.

3. The circuit as claimed in claim 1, wherein the opposing signal generating circuit for generating the opposing signal operates depending on an output signal of the synchronous demodulator.

4. The circuit as claimed in claim 1, wherein a phase shift and/or an amplitude of the opposing signal is/are evaluated.

5. The circuit as claimed in claim 1, wherein an output signal of the synchronous demodulator is evaluated.

6. The circuit as claimed in claim 1, wherein the electronic evaluation unit has a control circuit, wherein a phase shift of the opposing signal is used to adjust an output signal of the synchronous demodulator.

7. A method for evaluating measurement signals which are generated by the at least one sensor, with the circuit as claimed in claim 1, comprising the steps of:
    applying the control signal having the first frequency to the two conductors of the at least one sensor,
    generating the opposing signal having the first frequency and the modifiable phase angle,
    generating the evaluation signal originating from the measurement signal generated with the at least one sensor, and
    superposing the evaluation signal and the opposing signal and feeding the signal resulting from the superposition to the synchronous demodulator.

8. The method as claimed in claim 7, wherein the circuit is balanced automatically in a balancing operation by adjusting a phase shift of the opposing signal depending on an output signal of the synchronous demodulator.

9. The method as claimed in claim 8, wherein the phase shift of the opposing signal and a clock signal of the synchronous demodulator are set in a balancing operation in such a way that the evaluation signal, the opposing signal and the clock signal of the synchronous demodulator are in-phase.

10. The method as claimed in claim 9, wherein an amplitude of the opposing signal is adjusted in a balancing operation in such a way that the output signal of the synchronous demodulator has a value of zero or a predefined value.

11. The method as claimed in claim 7, wherein a phase shift of the opposing signal is evaluated.

12. The method as claimed in claim 7, wherein an output signal of the synchronous demodulator is evaluated.

13. The method as claimed in claim 7, wherein an output signal of the synchronous demodulator is adjusted to a value of zero or a predefined value.

14. The method as claimed in claim 13, wherein a phase shift and/or an amplitude of the opposing signal is/are provided as a setting parameter.

15. A sensor system for capacitively detecting an obstacle with at least one capacitive sensor and the circuit as claimed in claim 1 for evaluating measurement signals of the at least one capacitive sensor.

16. The system as claimed in claim 15, wherein if an obstacle is brought within a defined distance from the at least one capacitive sensor such that the at least one capacitive sensor is capable of detecting the obstacle within the defined distance, an output signal of a differentiator of the electronic evaluation unit and an input signal and an output signal of the synchronous demodulator change to define a signal deviation allowing for the obstacle to be detected through the signal deviation.

17. The method as claimed in claim 7, wherein an amplitude of the opposing signal has a value of zero or a predefined value in a balanced state of the circuit for evaluating measurement signals without the presence of an obstacle.

18. The method as claimed in claim 7, wherein the opposing signal is modified only during a balancing operation.

19. A circuit for evaluating measurement signals, the circuit comprising:
    a control circuit having a control section, the control circuit having a bridge circuit with a bridge branch including a first end and a second end;
    a sensor with a first conductor and a second conductor, the sensor being connected with the control circuit, the first conductor being connected to the first end of the bridge branch and the second conductor being connected to the second end of the bridge branch, the control section generating a control signal having a first frequency that is applied to the sensor; and
    an electronic evaluation unit generating an evaluation signal, the evaluation signal originating from a measurement signal generated by the sensor, the electronic evaluation unit having an opposing signal generating circuit for generating an opposing signal having the first frequency and a modifiable phase angle, the electronic evaluation unit superposing the opposing signal and the evaluation signal to produce a signal that is fed to a synchronous demodulator of the electronic evaluation unit to detect at least one obstacle within a defined distance from the sensor.

20. The circuit as claimed in claim 19, wherein either a DC voltage of an output of the synchronous demodulator or an amplitude or phase angle of the opposing signal can be used to evaluate an approach of the at least one obstacle.

\* \* \* \* \*